US007585057B2

(12) United States Patent
Hirota et al.

(10) Patent No.: US 7,585,057 B2
(45) Date of Patent: Sep. 8, 2009

(54) METHOD OF MANUFACTURING INK-JET HEAD

(75) Inventors: Atsushi Hirota, Nagoya (JP); Atsuo Sakaida, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 440 days.

(21) Appl. No.: 11/612,608

(22) Filed: Dec. 19, 2006

(65) Prior Publication Data

US 2007/0144000 A1 Jun. 28, 2007

(30) Foreign Application Priority Data

Dec. 26, 2005 (JP) ............................ 2005-371956

(51) Int. Cl.
*B41J 2/045* (2006.01)
*H01L 41/22* (2006.01)

(52) U.S. Cl. ........................................ 347/68; 29/25.35

(58) Field of Classification Search .................. 347/68, 347/69–72; 400/124.16; 29/25.35; 310/365–367, 310/311
See application file for complete search history.

(56) References Cited

U.S. PATENT DOCUMENTS 7,479,729 B2 * 1/2009 Sugahara et al. ............ 310/365
2004/0113994 A1 6/2004 Shinkai

FOREIGN PATENT DOCUMENTS

| | | | |
|---|---|---|---|
| EP | 1 459 898 | A2 | 9/2004 |
| EP | 1 495 869 | A1 | 1/2005 |
| JP | 2004-136663 | A | 5/2004 |

* cited by examiner

*Primary Examiner*—K. Feggins
(74) *Attorney, Agent, or Firm*—Baker Botts L.L.P.

(57) ABSTRACT

There is provided a method of manufacturing an ink-jet head comprising a passage unit, a piezoelectric actuator, and a wire member. The passage unit has a surface on which a pressure chamber is provided in a form of a recess. The piezoelectric actuator includes a piezoelectric body that closes the recess, an electrode that is formed on the piezoelectric body, and a conductive land that is formed on the electrode. The wire member includes a wiring provided thereon with a terminal electrically connected to the land. The method comprises the steps of forming on the electrode a land made of a resin paste, bonding the passage unit and the piezoelectric actuator to each other by pressing the land except a part thereof in a state where the electrode is opposed to the pressure chamber, and electrically connecting the land to the terminal by bringing the part of the land not pressed in the step of bonding into contact with the wire member.

9 Claims, 13 Drawing Sheets

METHOD OF MANUFACTURING INK-JET HEAD

BACKGROUND OF THE INVENTION

1. Field of the Invention

The present invention relates to a method of manufacturing an ink-jet head that ejects ink from an ink ejection port.

2. Description of Related Art

A known ink-jet head has a passage unit and a piezoelectric actuator bonded to the passage unit. The passage unit has an individual ink passage including an ink ejection port and a pressure chamber. The piezoelectric actuator applies pressure to ink contained in the pressure chamber. In some ink-jet heads of this type, on a surface of a piezoelectric actuator, an electrode is electrically connected to a wire member through which a drive signal is supplied to the electrode so that the piezoelectric actuator is driven. For example, U.S. Patent Application Publication No. 20040113994 discloses an ink-jet head in which an actuator unit acting as a piezoelectric actuator includes a piezoelectric body having four laminated piezoelectric layers, and conductive lands are provided on upper faces of respective individual electrodes that are formed on the piezoelectric body. Each of the lands is formed by printing a metal paste, such as a gold paste, in a pattern on the individual electrode and then baking the paste. The individual electrodes formed on the actuator unit are, through the lands, electrically connected to wire terminals formed on an FPC (Flexible Printed Circuit) which is a wire member disposed above the actuator unit. Only at the lands, the actuator unit is in contact with the FPC. The piezoelectric body and the FPC are sufficiently spaced apart by the lands sandwiched therebetween, so that they are not in contact with each other. Therefore, deformation of the piezoelectric body is not hindered by the FPC, and thus performance of ink ejection from ink ejection ports does not change.

SUMMARY OF THE INVENTION

However, in order to manufacture the ink-jet head disclosed in U.S. Patent Application Publication No. 20040113994, it is necessary that the lands made of the metal paste are baked at a high temperature. In such a baking process, the piezoelectric body may be warped, or a metal may be scattered inside the piezoelectric body to consequently deteriorate insulation resistance of the piezoelectric body. In addition, since a material such as gold is expensive, manufacturing costs increase. A possible way of solving the problems is to use, as a material of the lands, a resin paste including a conductive material bakeable at a low temperature, instead of the metal material. However, a resin paste is softer than a metal. Therefore, if, after the lands are formed, the piezoelectric actuator is pressed to the passage unit to bond them, the lands are crushed and their height is lowered. As a result, the piezoelectric body and the FPC cannot sufficiently be spaced apart from each other. Alternatively, in a case where heights of lands are uneven, a land having a larger height is pressed and it upper face is flattened. Such a land may become a defective contact. In order to avoid these drawbacks, it is conceivable that the lands are formed after the passage unit and the piezoelectric actuator are bonded to each other. However, pressure chambers are configured as recesses that are formed on a surface of the passage unit. Thus, a lower face of the piezoelectric actuator is partially supported on the passage unit, and partially not supported on the passage unit but opposed to the pressure chambers. In a case where, like this, the lower face of the piezoelectric actuator is partially supported on the passage unit, cracking may occur in the piezoelectric body due to force that is applied to the piezoelectric body at the time of printing the resin paste in a pattern on surfaces of the individual electrodes.

An object of the present invention is to provide a method of manufacturing an ink-jet head that can ensure a sufficient space between a piezoelectric body and a wire member while preventing occurrence of warping of the piezoelectric body, deterioration in insulation resistance of the piezoelectric body, and cracking in the piezoelectric body.

According to an aspect of the present invention, there is provided a method of manufacturing an ink-jet head comprising a passage unit, a piezoelectric actuator, and a wire member. The passage unit has an individual ink passage including an ink ejection port and a pressure chamber, and also has a surface on which the pressure chamber is provided in a form of a recess. The piezoelectric actuator applies ejection energy to ink in the pressure chamber. The piezoelectric actuator includes a piezoelectric body that is disposed on the surface of the passage unit to thereby close the recess, an electrode that is formed, so as to be opposed to the pressure chamber, on a surface of the piezoelectric body facing against the passage unit, and a conductive land that is formed on the electrode. The wire member includes a substrate and a wiring formed on the substrate and provided thereon with a terminal electrically connected to the land. The method comprises the steps of: forming, on the electrode, the land made of a resin paste including a conductive material, in a state where a whole of a face of the piezoelectric actuator opposite to a face thereof formed with the land is supported on a support member; bonding the passage unit and the piezoelectric actuator to each other by pressing the land except a part thereof in a state where the piezoelectric actuator is disposed on the surface of the passage unit with the electrode being opposed to the pressure chamber; and electrically connecting the land to the terminal by bringing the part of the land not pressed in the step of bonding into contact with the wire member.

In the aspect, the land is made of the resin paste. It is therefore not necessary to bake the land at a high temperature when forming the land. This can suppress warping of the piezoelectric body, and scattering of a conductive material included in the land into the piezoelectric body which deteriorates insulation resistance of the piezoelectric body. In addition, since the land is made of the resin paste, manufacturing costs can be reduced as compared with when the land is made of a metal material such as gold.

Besides, since the land is formed on the piezoelectric actuator before the piezoelectric actuator is bonded to the passage unit, the land can be formed under a state where the whole of the face of the piezoelectric actuator opposite to a face thereof formed with the land is supported on the support member. This makes it difficult that cracking occurs in the piezoelectric body.

Moreover, when bonding the piezoelectric actuator to the passage unit, the land is pressed except a part thereof. Therefore, the part of the land is not crushed due to a bonding press. Thus, the part of the land is not reduced in height, so that a sufficient space is ensured between the piezoelectric body and the wire member. This can prevent ejection failure which may otherwise be caused by occurrence of contact between the wire member and the piezoelectric body.

Further, an upper face of the unpressed part of the land is not flat. Therefore, when electrically connecting the land to the terminal, unevenness of a height of the land can be absorbed, so that the land and the terminal can surely be connected to each other.

Still further, when bonding the piezoelectric actuator to the passage unit, the piezoelectric body is not directly pressed but indirectly pressed with the land therebetween. Therefore, even if a small foreign matter exists between the piezoelectric body and the jig or a small protrusion exists on the surface of the piezoelectric body, occurrence of cracking or the like in the piezoelectric body can be prevented.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

Figure 1:
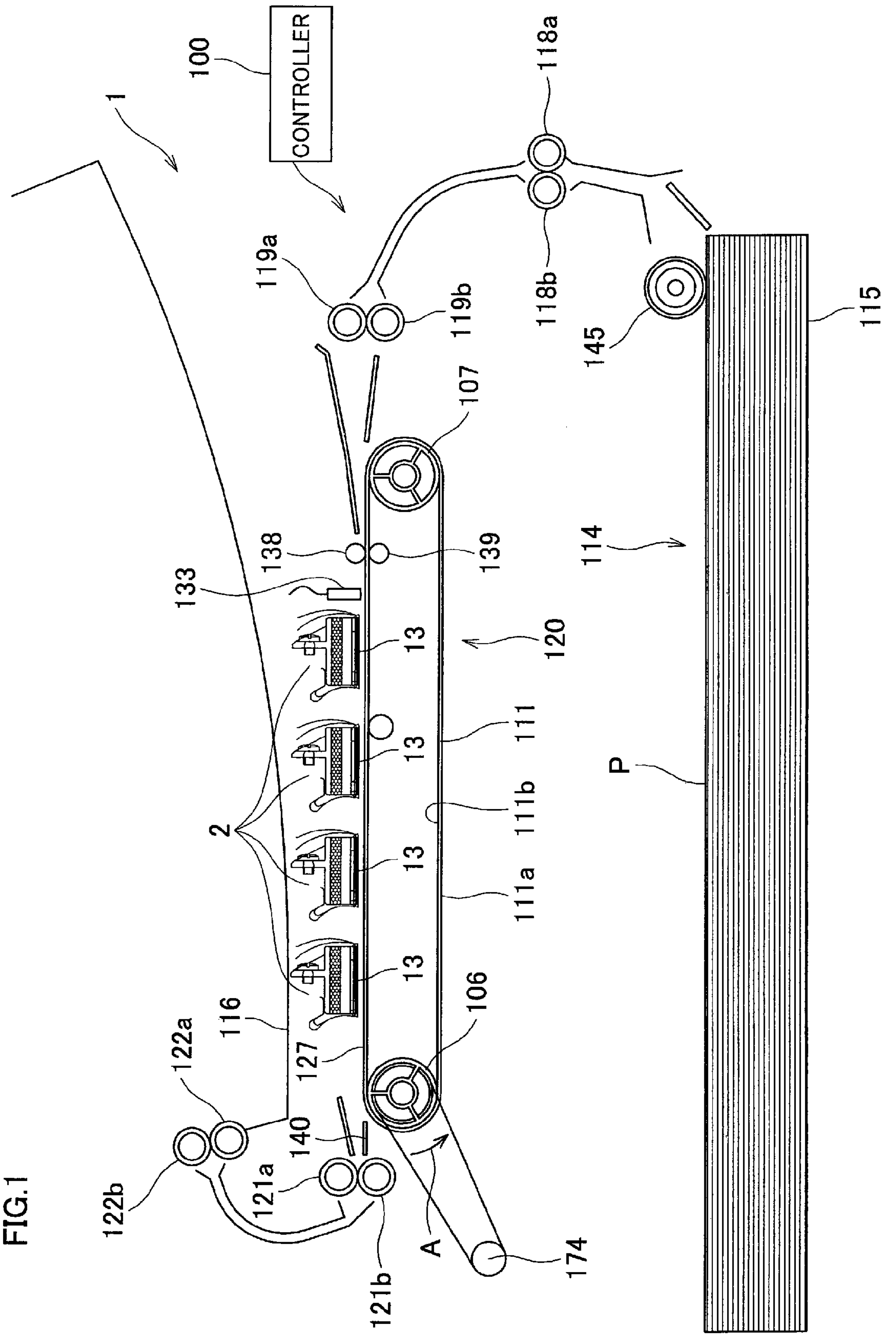
FIG. 1 schematically illustrates a construction of an ink-jet printer having ink-jet heads manufactured by the method according to an embodiment of the present invention.

A description will be given to an ink-jet head manufactured by a method according to an embodiment of the present invention. FIG. 1 illustrates a printer 1 that includes ink-jet heads 2 manufactured by the method according to this embodiment. The printer 1 illustrated in FIG. 1 is a color ink-jet printer of line-head type, which includes four fixed ink-jet heads 2. In a plan view, the ink-jet head 2 has a rectangular shape elongated in a direction perpendicularly crossing the drawing sheet of FIG. 1. The printer 1 includes a paper feed unit 114, a paper discharge tray 116, and a conveyance unit 120, which are shown in lower, upper, and middle parts of FIG. 1, respectively. The printer 1 also includes a controller 100 that controls operations of the above-mentioned units.

The paper feed unit 114 has a paper holder 115 and a paper feed roller 145. A stack of printing papers (recording media) P of rectangular shape can be held in the paper holder 115. The paper feed roller 145 sends out to the conveyance unit 120 an uppermost one of the printing papers P held in the paper holder 115. In the paper holder 115, the printing paper P is held so as to be sent out in a direction along its longer side. Two pairs of feed rollers 118*a* and 118*b*, and 119*a* and 119*b* are disposed along a conveyance path between the paper holder 115 and the conveyance unit 120. The printing paper P discharged from the paper feed unit 114 is, with one shorter side thereof being a leading edge, sent upward in FIG. 1 by the feed rollers 118*a* and 118*b*. Then, by the feed rollers 119*a* and 119*b*, the printing paper P is sent leftward to the conveyance unit 120.

The conveyance unit 120 has an endless conveyor belt 111, and two belt rollers 106 and 107 on which the conveyor belt 111 is wound. A length of the conveyor belt 111 is adjusted in such a manner that a predetermined tension occurs in the conveyor belt 111 in a state where the conveyor belt 111 is wound on the two belt rollers 106 and 107. The conveyor belt 111, which is wound on the two belt rollers 106 and 107, has two parallel planes each including a tangent line common to the belt rollers 106 and 107. One of the two planes opposed to the ink-jet heads 2 forms a conveyor face 127 for the printing paper P. On the conveyor face 127 formed by the conveyor belt 111, the printing paper P sent out of the paper feed unit 114 is conveyed while the ink-jet heads 2 perform printing on an upper face (printing face) of the printing paper P. Then, the printing paper P reaches the paper discharge tray 116. The printing papers P thus printed are piled in the paper discharge tray 116.

Each of the four ink-jet heads 2 has a head main body 13 at its lower end. The head main body 13 is made of a passage unit 4 and four piezoelectric actuators 21 that are bonded to the passage unit 4 with an adhesive (see FIGS. 2 and 4). As will be described later, many individual ink passages 32 each including an ink ejection port 8 and a pressure chamber 10 are formed inside the passage unit 4. Pressure is applied to ink in the pressure chamber 10. The piezoelectric actuator 21 applies pressure to ink contained in desired one(s) of many pressure chambers 10. Bonded to an upper face of each piezoelectric actuator 21 is an FPC 50 acting as a wire member that supplies a printing signal to the piezoelectric actuator (see FIG. 5).

Figure 2:
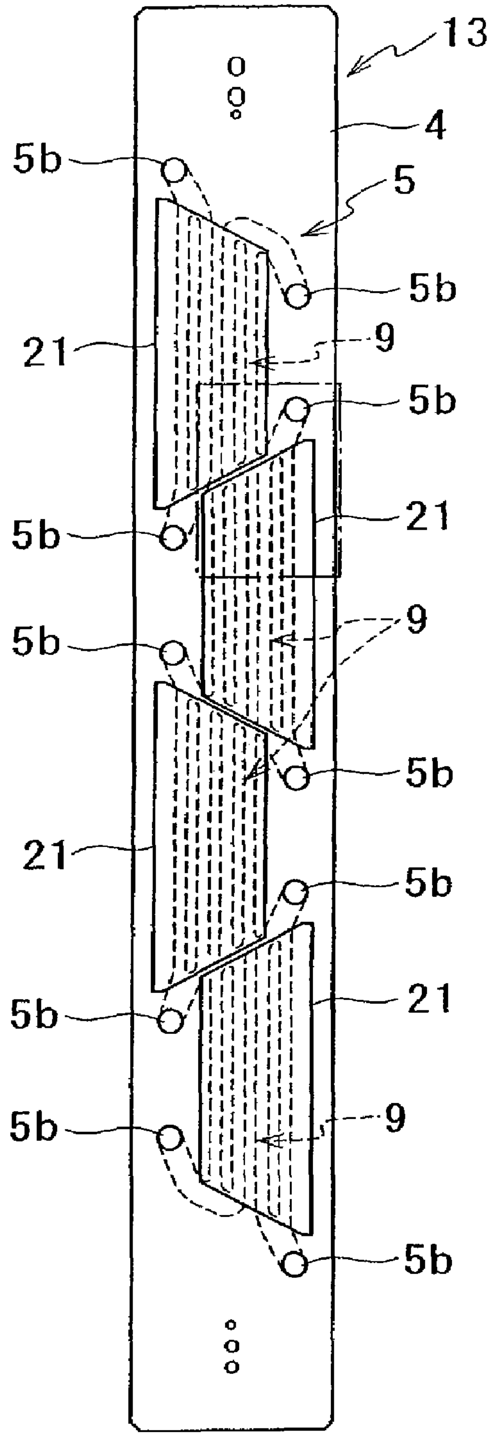
FIG. 2 is a plan view of a head main body that is illustrated in FIG. 1.
Figure 3:
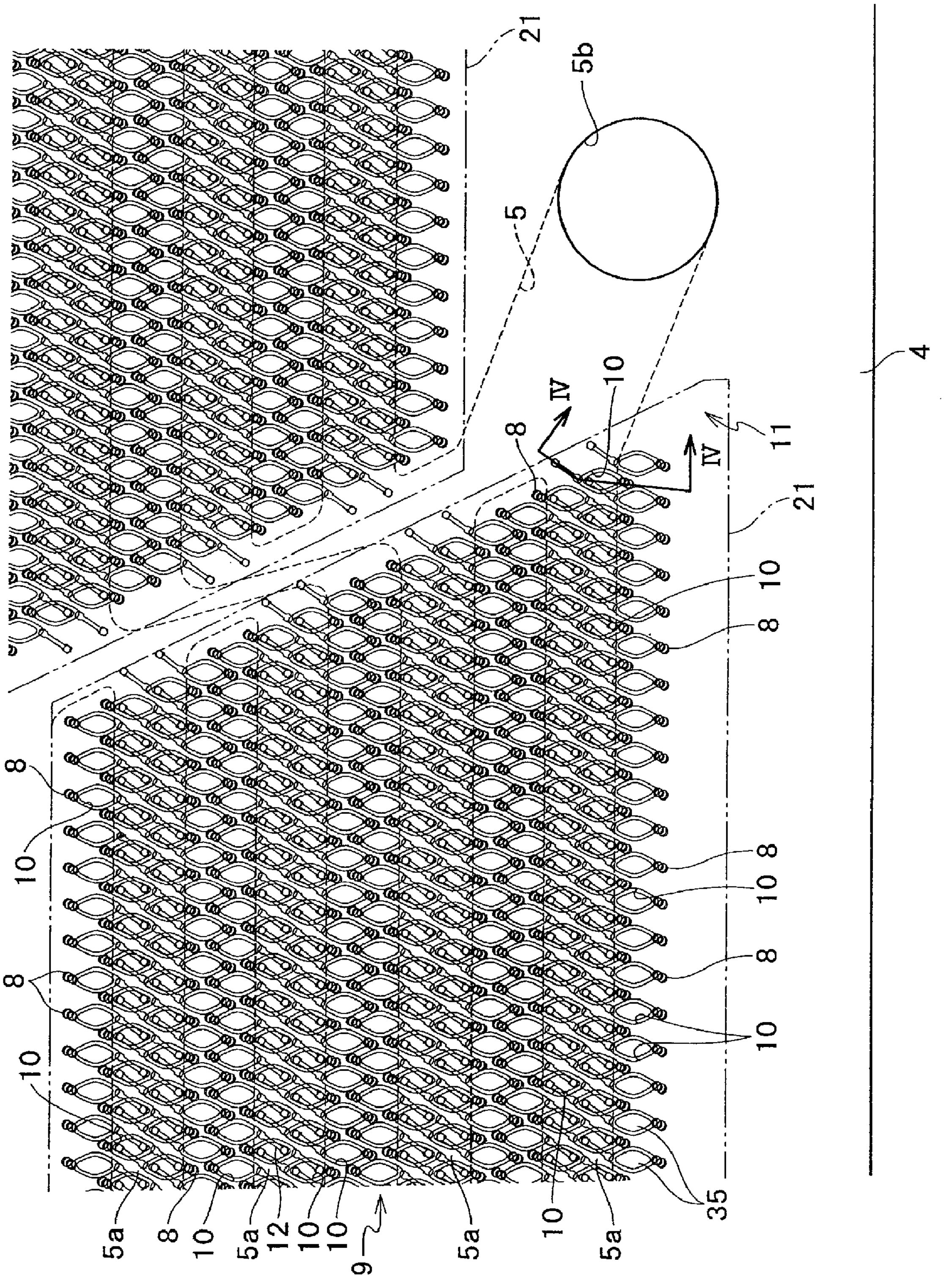
FIG. 3 is a partial view of FIG. 2 on an enlarged scale.

In a plan view, as shown in FIG. 2, the head main body 13 has a rectangular shape elongated in a direction perpendicularly crossing the drawing sheet of FIG. 1. The four head main bodies 13 are arranged adjacent to each other along a horizontal direction of the drawing sheet of FIG. 1. Each of the four head main bodies 13 has, on its bottom face (ink ejection face), many small-diameter ink ejection ports 8, as shown in FIG. 3. A color of ink ejected from the ink ejection port 8 is any of magenta (M), yellow (Y), cyan (C), and black (K). Many ink ejection ports 8 included in one head main body 13 eject ink of the same color. Besides, the four head main bodies 13 eject, from their many ink ejection ports 8, ink of four different colors of magenta, yellow, cyan, and black, respectively.

A narrow space is formed between the bottom faces of the head main bodies 13 and the conveyor face 127 of the conveyor belt 111. The space constitutes a conveyance path along which the printing paper P is conveyed from right to left in FIG. 1. While the printing paper P passes under the four head main bodies 13, ink is ejected from the ink ejection ports 8 toward the upper face of the printing paper P in accordance with image data, so that a desired colored image is formed on the printing paper P.

The two belt rollers 106 and 107 are in contact with an inner surface 111*b* of the conveyor belt 111. Among the two belt rollers 106 and 107 of the conveyance unit 120, the belt roller 106 which locates downstream in the conveyance path is connected to a drive shaft 174 of an unillustrated conveyor motor. The conveyor motor is driven in rotation under control of the controller 100. The other belt roller 107 is a slave roller that is rotated by rotational force given by the conveyor belt 111 along with rotation of the belt roller 106.

A nip roller 138 and a nip bearing roller 139 are disposed near the belt roller 107, so as to sandwich the conveyor belt 111 therebetween. The nip roller 138 is biased downward by an unillustrated spring, in order to press, to the conveyor face 127, the printing paper P supplied to the conveyance unit 120. The conveyor belt 111 and the printing paper P are nipped between the nip roller 138 and the nip bearing roller 139. Since an outer surface of the conveyor belt 111 is treated with adherent silicone rubber, the printing paper P surely adheres to the conveyor face 127.

As shown in FIG. 1, a peeling plate 140 is provided on a left side of the conveyance unit 120. A right end of the peeling plate 140 goes into between the printing paper P and the conveyor belt 111, thereby peeling the printing paper P, which adheres to the conveyor face 127 of the conveyor belt 111, from the conveyor face 127.

Two pairs of feed rollers 121*a* and 121*b*, and 122*a* and 122*b* are disposed between the conveyance unit 120 and the paper discharge tray 116. The printing paper P discharged from the conveyance unit 120 is, with one shorter side thereof being a leading edge, sent upward in FIG. 1 by the feed rollers 121*a* and 121*b*. Then, the printing paper P is sent to the paper discharge tray 116 by the feed rollers 122*a* and 122*b*.

A paper sensor 133, which is an optical sensor made up of a light emitting body and a light receiving body, is disposed between the nip roller 138 and the most upstream one of the ink-jet heads 2, in order to detect a position of the leading edge of the printing paper P on the conveyance path.

Next, details of the head main body 13 will be described. FIG. 2 is a plan view of the head main body 13 illustrated in FIG. 1. FIG. 3 is a plan view, on an enlarged scale, of a block enclosed with an alternate long and short dash line in FIG. 2. In FIG. 3, for the purpose of easy understanding, the piezoelectric actuators 21 are illustrated with broken lines though they should be illustrated with solid lines, while ink ejection ports 8, pressure chambers 10, and apertures 12, which actually should be illustrated with broken lines, are illustrated with solid lines.

As shown in FIGS. 2 and 3, the head main body 13 has a passage unit 4 in which formed are many pressure chambers 10 and many ink ejection ports 8. The many pressure chambers 10 form four pressure chamber groups 9. Pressure is applied to ink in the respective pressure chambers 10, thus ejecting the ink from the many ink ejection ports 8. Four piezoelectric actuators 21 of trapezoidal shape are bonded to an upper face of the passage unit 4. The piezoelectric actuators 21 are arranged in two rows and in a zigzag pattern along a longitudinal direction of the passage unit 4. To be more specific, each of the piezoelectric actuators 21 is disposed with its parallel opposed sides, that is, its upper and lower sides, extending along the longitudinal direction of the passage unit 4. In addition, oblique sides of every neighboring piezoelectric actuators 21 partially overlap each other with respect to a widthwise direction of the passage unit 4.

Regions of a lower face of the passage unit 4 corresponding to where the piezoelectric actuators 21 are bonded define ink ejection regions. As shown in FIG. 3, many ink ejection ports 8 are regularly arranged in the ink ejection regions. On the upper face of the passage unit 4, many pressure chambers 10 are regularly arranged in two dimensions (in a matrix). The pressure chambers 10 are configured as recesses that are formed on the upper face of the passage unit 4. The recesses are closed with the piezoelectric actuators 21, so that the pressure chambers 10 are defined. As a result, a lower face of the piezoelectric actuator 21 is partially supported on the passage unit 4, and partially not supported on the passage unit 4 but opposed to the pressure chambers 10.

In the upper face of the passage unit 4, one pressure chamber group 9 is made up of pressure chambers 10 that exist within a region opposed to one piezoelectric actuator 21. As will be described later, an individual electrode 35 formed on the piezoelectric actuator 21 is opposed to each pressure chamber 10 in one-to-one correspondence.

Manifold channels 5 acting as common ink chambers, and sub manifold channels 5*a* acting as branch passages of the common ink chambers, are formed inside the passage unit 4. One ink ejection region is opposed to four sub manifold channels 5*a* which extend in the longitudinal direction of the passage unit 4. Through ink flow-in openings 5*b* provided on the upper face of the passage unit 4, ink is supplied to the manifold channels 5.

Ink goes through an outlet of the sub manifold channel 5*a*, then through an aperture 12 which acts as a throttle and a pressure chamber 10 which has a substantially rhombic shape in a plan view, and then ejected from an ink ejection port 8. Rows of ink ejection ports 8 extend in the longitudinal direction of the passage unit 4. Ink that is ejected from ink ejection ports 8 included in four neighboring rows is supplied from the same sub manifold channel 5*a*.

The many ink ejection ports 8 of the passage unit 4 are positioned in such a manner that their projective points on an imaginary line extending in the longitudinal direction of the passage unit 4 (i.e., extending perpendicularly to the paper conveyance direction) can be arranged at regular intervals of 600 dpi, when all of them are projected onto the imaginary line in a direction perpendicular to the imaginary line.

Figure 4:
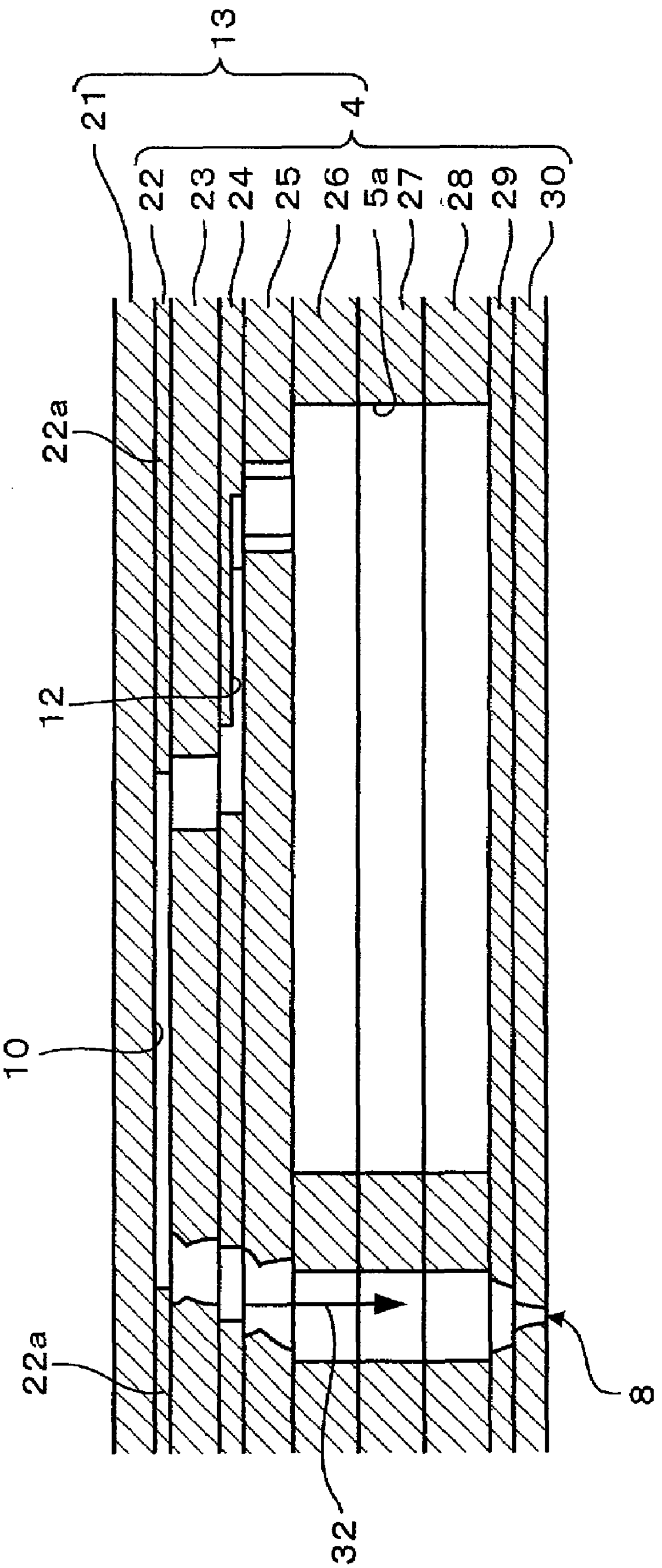
FIG. 4 is a sectional view taken along line IV-IV in FIG. 3.

A cross-sectional structure of the head main body 13 will be described. FIG. 4 is a sectional view taken along line IV-IV in FIG. 3. As shown in FIG. 4, the head main body 13 is made of the passage unit 4 and the piezoelectric actuator 21 bonded to each other. The passage unit 4 has a layered structure in which, from the top, a cavity plate 22, a base plate 23, an aperture plate 24, a supply plate 25, manifold plates 26, 27, 28, a cover plate 29, and a nozzle plate 30 are put in layers. Formed inside the passage unit 4 are ink passages extending to the ink ejection ports 8 at which ink supplied from outside is ejected as ink droplets. The ink passages include the manifold channels 5 and the sub manifold channels 5*a* that temporarily store ink therein, and also include individual ink passages 32 each extending from an outlet of the sub manifold channel 5*a* to an ink ejection port 8. Recesses and holes, which constitute parts of the ink passages, are formed in the respective plates 22 to 30.

The cavity plate 22 is a metal plate in which formed are many substantially rhombic holes serving as pressure chambers 10. The base plate 23 is a metal plate in which formed are many connection holes each connecting each pressure chamber 10 to a corresponding aperture 12 and many connection holes each constituting a part of a passage from each pressure chamber 10 to a corresponding ink ejection port 8. The aperture plate 24 is a metal plate in which formed are many holes serving as apertures 12 and many connection holes each constituting a part of a passage from each pressure chamber 10 to a corresponding ink ejection port 8. The supply plate 25 is a metal plate in which formed are many connection holes each connecting each aperture 12 to a sub manifold channel 5*a* and many connection holes each constituting a part of a passage from each pressure chamber 10 to a corresponding ink ejection port 8. Each of the manifold plates 26, 27, and 28 is a metal plate in which formed are holes constituting sub-manifold channels 5*a* and many connection holes each constituting a part of a passage from each pressure chamber 10 to a corresponding ink ejection port 8. The cover plate 29 is a metal plate in which formed are many connection holes each constituting a part of a passage from each pressure chamber 10 to a corresponding ink ejection port 8. The nozzle plate 30 is a metal plate in which many through holes are formed. The through holes constitute ink ejection ports 8 on an outside face of the nozzle plate 30. The nine metal plates are positioned in layers so as to form individual ink passages 32.

Figure 5:
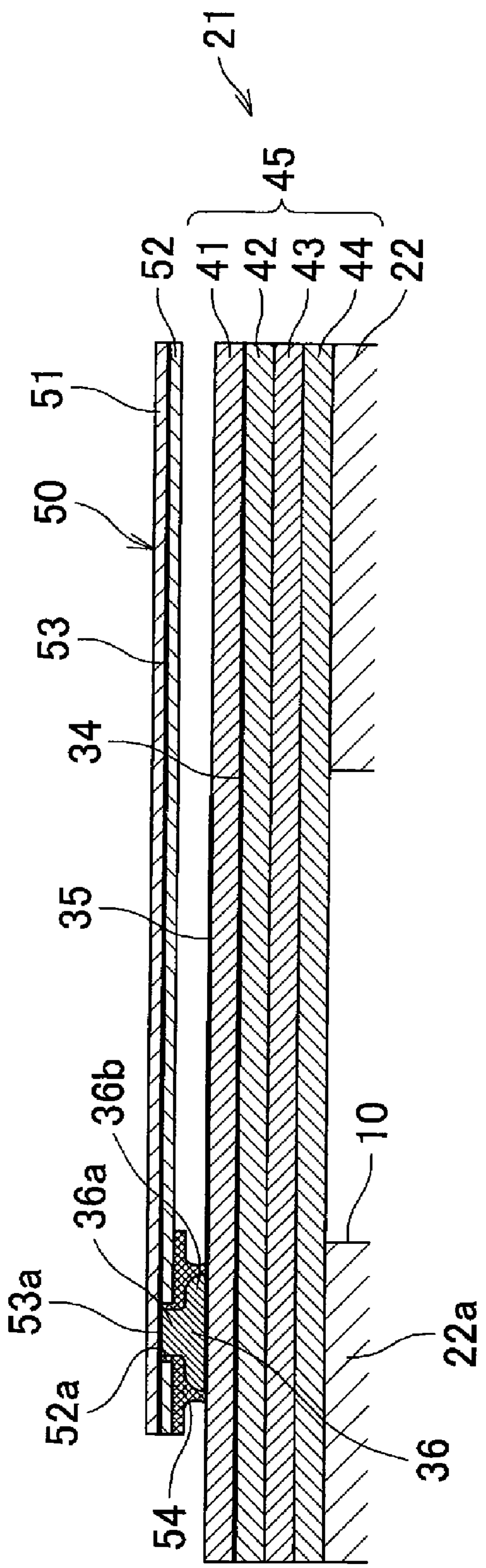
FIG. 5 is a partial view of FIG. 4 on an enlarged scale, including an FPC.

As shown in FIG. 5, the piezoelectric actuator 21 includes a piezoelectric body 45 having a layered structure of four piezoelectric layers 41, 42, 43 and 44. Each of the piezoelectric layers 41 to 44 has the same thickness of approximately 15 μm, and thus the piezoelectric actuator 21 has a thickness of approximately 60 μm. Any of the piezoelectric layers 41 to 44 is a continuous layer-like flat plate (continuous flat layer) extending over all the pressure chambers 10 formed in one ink ejection region of the head main body 13. The piezoelectric layers 41 to 44 are made of a lead zirconate titanate (PZT)-base ceramic material having ferroelectricity.

An individual electrode 35 having a thickness of approximately 1 μm is formed on the uppermost piezoelectric layer 41. The individual electrode 35 and a later-described common electrode 34 are formed by printing a conductive paste that includes a conductive material such as a metal. The individual electrode 35 has a substantially rhombic shape in a plan view. The individual electrode 35 is formed so that it is opposed to the pressure chamber 10 and besides its most part falls within the pressure chamber 10 in a plan view. Consequently, substantially over a whole area on the uppermost piezoelectric layer 41, many individual electrodes 35 are regularly arranged in two dimensions in the same pattern as that of the pressure chambers 10, as shown in FIG. 3. In this embodiment, the individual electrodes 35 are formed only on a surface of the piezoelectric actuator 21, and therefore only the outermost piezoelectric layer 41 includes active regions that cause piezoelectric strain. The other piezoelectric layers 42, 43, and 44 are inactive layers. Accordingly, the piezoelectric actuator 21 is an actuator that has active and inactive layers laminated and causes unimorph deformation, thus presenting a good efficiency of deformation.

One acute portion of the individual electrode 35 is not opposed to the pressure chamber 10. Specifically, the one acute portion extends to a position above a beam 22*a* of the cavity plate 22 which means a portion of the cavity plate 22 where the pressure chamber 10 is not formed. The beam 22*a* is bonded to and supports the piezoelectric actuator 21. A land 36 made of a conductive resin paste is provided on a portion of the individual electrode 35 not opposed to the pressure chamber 10. The land 36 has a diameter of approximately 30 μm in a plan view. The individual electrode 35 and the land 36 are electrically connected to each other. The land 36 has a substantially circular shape in a plan view. As shown in FIG. 5, a central portion of the land 36 forms a protrusion 36*a* that protrudes above a peripheral portion 36*b* surrounding the protrusion 36*a*. The protrusion 36*a* has a diameter of approximately 15 μm in a plan view. As will be detailed later, each land 36 is electrically connected, through a wiring 53 provided on the FPC 50, to an unillustrated driver IC which is a part of the controller 100.

A common electrode 34 having a thickness of approximately 2 μm is interposed between the uppermost piezoelectric layer 41 and the piezoelectric layer 42 disposed under the uppermost piezoelectric layer 41. The common electrode 34 is formed substantially over an entire face of the piezoelectric actuator 21. As a result, the piezoelectric layer 41 is, in its portion opposed to the pressure chamber 10, sandwiched between a pair of electrode including the individual electrode 35 and the common electrode 34. An electrode is disposed neither between the piezoelectric layers 42 and 43 nor between the piezoelectric layers 43 and 44.

On the piezoelectric layer 41, an unillustrated surface electrode is formed outside an electrode group made up of the individual electrodes 35. The surface electrode is electrically connected to the common electrode 34 through an unillustrated conductive member that is embedded in a through hole formed in the piezoelectric layer 41. In addition, the surface electrode is also connected to an unillustrated wiring provided on the FPC 50. Through the wiring, the common electrode 34 is grounded. Consequently, the common electrode 34 is, in its portions corresponding to all the pressure chambers 10, equally kept at the ground potential. An unillustrated land having the same shape as that of the land 36 is provided on the surface electrode.

Figure 6:
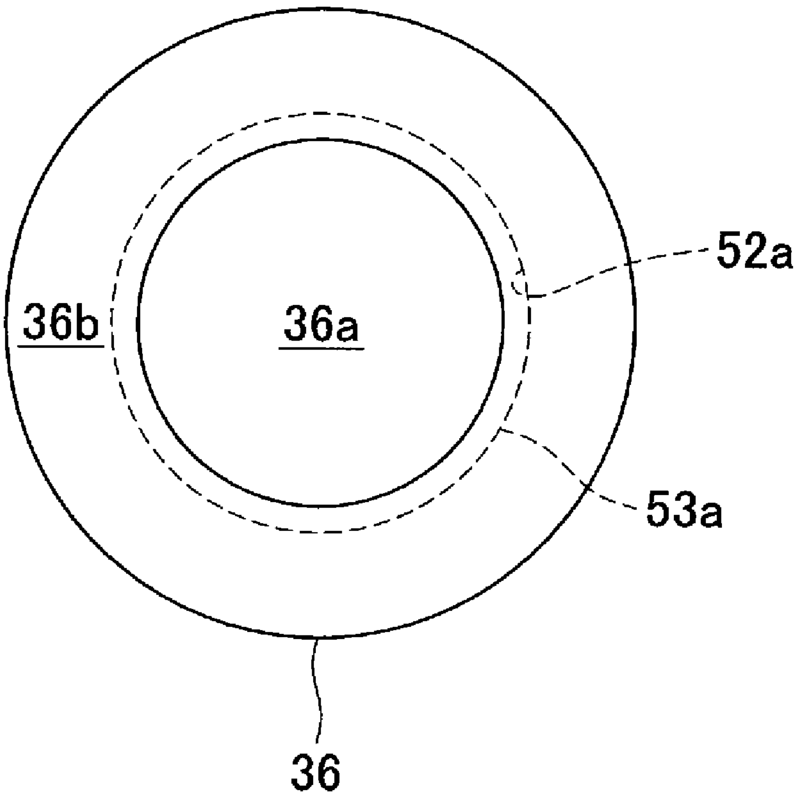
FIG. 6 is a diagram schematically showing a positional relationship in a plan view between a land of a piezoelectric actuator and a wire terminal of the FPC.

As shown in FIG. 5, the FPC 50 acting as a wire member is disposed above the piezoelectric actuator 21. The FPC 50 has an insulating substrate 51, a wiring 53 formed on the substrate 51 in a pattern, and a covering layer 52 sandwiching the wiring 53 with the substrate 51 to thereby protect the wiring 53. A through hole 52*a* having a diameter of approximately 17 μm is formed at a portion of the covering layer 52 overlapping in a plan view the protrusion 36*a* of each land 36. The wiring 53 is exposed at a bottom of the through hole 52*a*, and an exposed region of the wiring 53 serves as a terminal 53*a* having a diameter of approximately 17 μm. The terminal 53*a* is electrically bonded to an end of the protrusion 36*a* of the land 36, so that the individual electrode 35 and the wiring 53 are electrically connected through the land 36. FIG. 6 shows a positional relationship in a plan view between the land 36 and the terminal 53*a*.

A side face of the land 36 is covered with a synthetic resin layer 54 made of a thermosetting synthetic resin material. Thereby, the land 36 is stably fixed to the FPC 50. In addition, a portion of the synthetic resin layer 54 covering the side face of the land 36 allows the piezoelectric body 45 and the FPC 50 to be physically firmly fixed to each other. Moreover, electrical insulation between the individual electrode 35 and the other wirings 53 can be improved. Like the land provided on the individual electrode 35, the land provided on the surface electrode is also electrically bonded to a terminal of another wiring formed on the FPC 50.

Here, an operation of the actuator unit 21 will be described. In the actuator unit 21, only the piezoelectric layer 41 among the four piezoelectric layers 41 to 44 is polarized in a direction oriented from the individual electrode 35 toward the common electrode 34. When the driver IC gives a predetermined potential to an individual electrode 35, voltage is applied to an active region of the piezoelectric layer 41, that is, a region of the piezoelectric layer 41 sandwiched between the individual electrode 35 given the predetermined potential and the common electrode 43 kept at the ground potential. As a result, an electric field in a thickness direction is generated in the region of the piezoelectric layer 41, so that the active region of the piezoelectric layer 41 contracts in a direction perpendicular to a polarization direction by a transversal piezoelectric effect. The other piezoelectric layers 42 to 44 do not contract in this way, because the electric field is not applied thereto. Therefore, portions of the piezoelectric layers 41 to 44 opposed to the active region, as a whole, present unimorph deformation protruding toward the pressure chamber 10. This reduces the volume of the pressure chamber 10 thus raising ink pressure, so that ink is ejected from the ink ejection port 8 shown in FIG. 4. Then, when the potential of the individual electrode 35 returns to the ground potential, the piezoelectric layers 41 to 44 restore their original shapes and the pressure chamber 10 restores its original volume. Ink is accordingly sucked from the sub manifold channel 5*a* into the individual ink passage.

In another driving mode, a predetermined potential is given to the individual electrode 35 beforehand. Upon every ejection request, the individual electrode 35 is once set at the ground potential and then given the predetermined potential again at a predetermined timing. In this mode, at a timing of setting the individual electrode 35 at the ground potential, the piezoelectric layers 41 to 44 return to their original state and the volume of the pressure chamber 10 becomes larger than in an initial state where a predetermined voltage is applied beforehand. Therefore, ink is sucked from the sub manifold channel 5*a* into the pressure chamber 10. Then, at a timing of giving the predetermined potential to the individual electrode 35 again, portions of the piezoelectric layers 41 to 44 opposed to the active region deform protrudingly toward the pressure chamber 10. The volume of the pressure chamber 10 accordingly changes to raise ink pressure, so that ink is ejected from the ink ejection port 8.

Next, a method of manufacturing the head main body 3 will be described with reference to FIGS. 7A to 7D. FIGS. 7A to 7D are sectional views showing step by step a method of manufacturing the head main body 13.

To manufacture the head main body 13, the above-described passage unit 4 is prepared in advance by putting the plates 22 to 30 in layers and bonding them to each other. Meanwhile, a conductive paste which is to be the common electrode 34 is printed in a pattern on a green sheet made of a ceramic material which is to be the piezoelectric layer 42, while a conductive paste which is to be the individual electrodes 35 is printed in a pattern on a green sheet made of a ceramic material which is to be the piezoelectric layer 41. Here, an Ag—Pd-base paste is used for the common electrode 34, and an Au-base paste is used for the individual electrodes 35. A thickness of the common electrode 34 is approximately 2 μm, and a thickness of the individual electrodes 35 is approximately 1 μm. Subsequently, the four piezoelectric layers 41 to 44 are positioned in layers to obtain a layered body which is then baked at a predetermined temperature, thereby forming the piezoelectric body 45 that includes the four piezoelectric layers 41 to 44 and supports the electrodes 34 and 35.

Figure 7A:
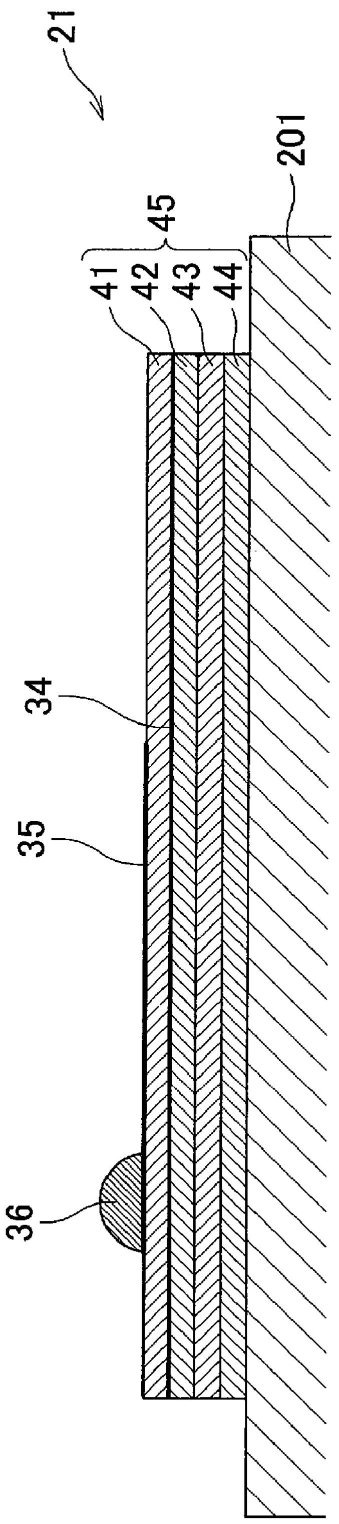
FIGS. 7A to 7D are sectional views showing step by step a method of manufacturing the ink-jet head that is illustrated in FIG. 1

Thereafter, as shown in FIG. 7A, the land 36 made of a resin paste including a conductive material is formed on each individual electrode 35, to be more specific, on a region of the individual electrode 35 not opposed to the pressure chamber 10 as described above, by means of a mask printing (land forming step). At this time, a whole of a lower face of the piezoelectric body 45 is supported on a support member 201. The resin paste is for example a printing paste including ceramic particles and conductive particles. Each of the particles is formed of a spherical particle. Silicon dioxide, aluminum oxide, or the like is used for the ceramic particles. The conductive particle includes a vinyl or acrylic resin particle as a core material, on a surface of which a layer of a metal such as Au, Ni, Cu, or the like is formed. The resin paste is printed in a predetermined pattern and then baked at approximately 150 to 200 degrees C. Thereby, resin paste is cured to form the lands 36. In this embodiment, the operation is performed at approximately 180 degrees C.

Figure 7B:
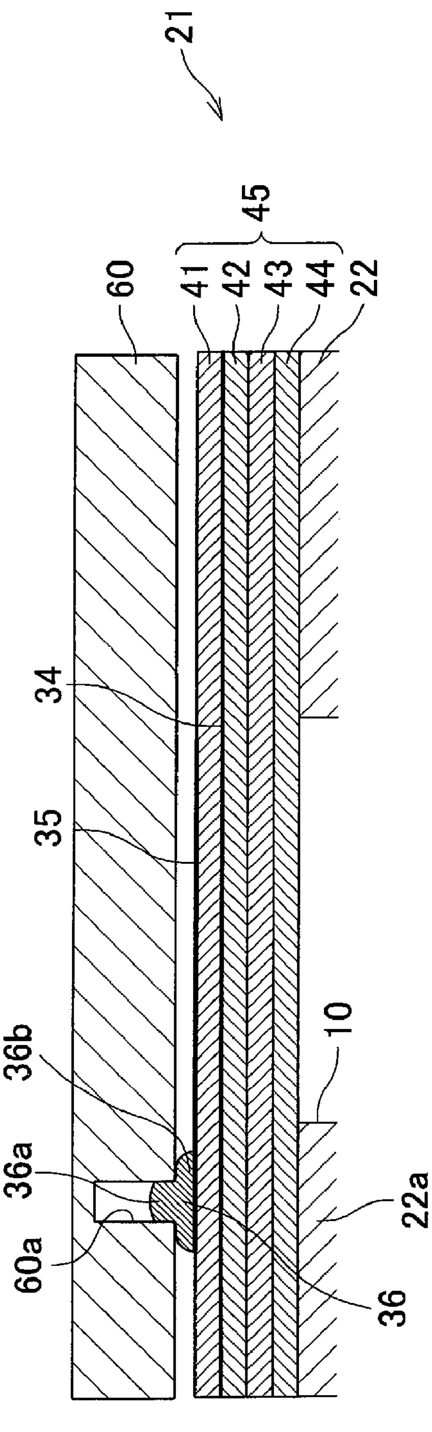

Next, as shown in FIG. 7B, the piezoelectric actuator 21 is disposed on the passage unit 4 with a thermosetting adhesive therebetween in such a manner that the pressure chambers 10 and the individual electrodes 35 are opposed to each other. Under this condition, by use of a plate-like jig 60 capable of temperature control with a built-in heater, the lands 36 are pressed down while heating up to a curing temperature of the thermosetting adhesive or higher. As a result, the thermosetting adhesive is cured, and the piezoelectric actuator 21 is bonded to the passage unit 4 with the thermosetting adhesive (bonding step).

A recess 60*a* is formed on a lower face of the jig 60 used at this time. The recess 60*a* is in a plan view smaller than a contour of the land 36, and a depth of the recess 60*a* is larger than a height of the land 36. In addition, the recess 60*a* is in a plan view smaller than a contour of the terminal 53*a* and a contour of the through hole 52*a*. To be specific, the recess 60*a* has a diameter of approximately 15 μm in a plan view. In the bonding step, the jig 60 is positioned so as to locate the recess 60*a* at a central portion of the land 36 in a plan view, and then the land 36 is pressed by the jig 60. Pressing force is applied only to a portion of the land 36 not overlapping the recess 60*a* in a plan view, which means the peripheral portion 36*b* of the land 36. The peripheral portion 36*b* is pressed by the jig 60 and thus reduced in height. Here, no matter how large the pressing force is, the height of the peripheral portion 36*b* is not reduced beyond a certain limit. On the other hand, the central portion surrounded by the peripheral portion 36*b* is not pressed by the jig 60 and therefore not reduced in height. As a result, the central portion of the land 36 becomes the protrusion 36*a* that protrudes upward more largely than the peripheral portion 36*b* does.

Figure 7C:
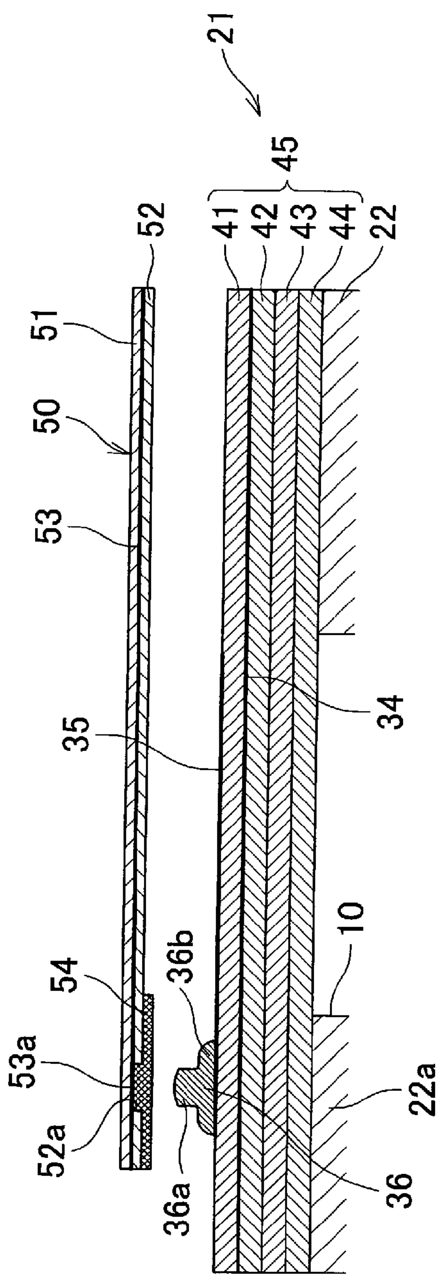

Next, as shown in FIG. 7C, the FPC 50 is disposed above the piezoelectric actuator 21 in such a manner that the protrusion 36*a* and the through hole 52*a* overlap each other in a plan view. The synthetic resin layer 54, which is not cured, is formed on the FPC 50 so as to cover the terminal 53*a* exposed from the covering layer 52 and therearound.

Figure 7D:
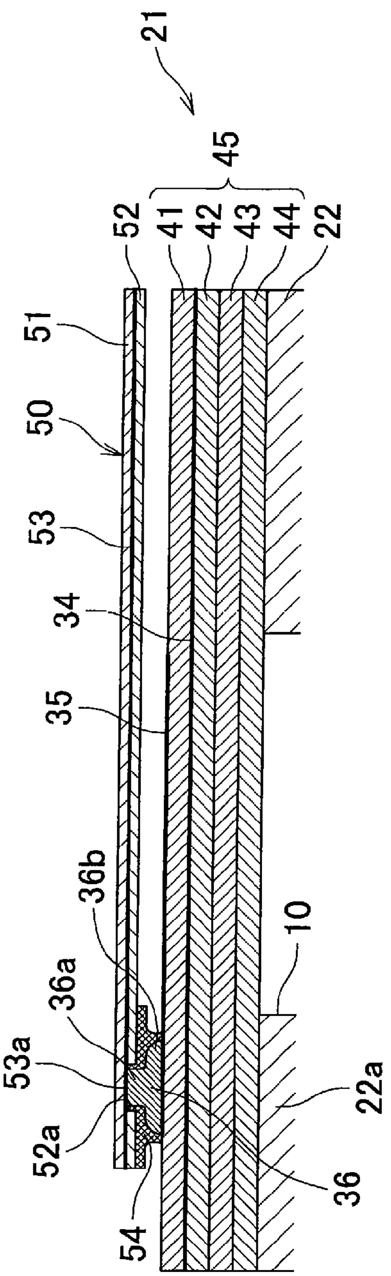

Then, as shown in FIG. 7D, by use of an unillustrated plate-like jig capable of temperature control with a built-in heater, the land 36 of the piezoelectric actuator 21 is pressed by the FPC 50 which has been positioned in such a manner that the protrusion 36*a* and the through hole 52*a* overlap each other in a plan view, while heating up to a curing temperature of the synthetic resin layer 54 or higher. At this time, the synthetic resin layer 54 is once softened in a curing process. The protrusion 36*a* of the land 36 penetrates the synthetic resin layer 54 thus softened, to reach the terminal 53*a* thereby electrically bonding the land 36 to the terminal 53*a*. Then, the synthetic resin layer 54 is cured, to physically fix the land 36 to the FPC 50 (connecting step). The head main body 13 is manufactured in the above-described manner.

In the above-described embodiment, since the land 36 is made of a resin paste including a conductive material, the land can be cured at a lower temperature than a land made of a metal paste can. This can suppress warping of the piezoelectric layers 41 to 44 in a curing process of the land 36, and scattering of a metal material inside the piezoelectric layers 41 to 44 which deteriorates insulation resistance of the piezoelectric layers 41 to 44. In addition, since the land 36 is made of a resin paste, manufacturing costs can be reduced as compared with when the land 36 is made of a metal material such as gold.

Besides, since the lands 36 are formed on the piezoelectric actuator 21 before the piezoelectric actuator 21 is bonded to the passage unit 4, the lands 36 can be formed under a state where the whole of the lower face of the piezoelectric actuator is supported on the support member 201. This makes it difficult that, when forming lands, cracking occurs in the piezoelectric body 45.

Moreover, when bonding the piezoelectric actuator 21 to the passage unit 4, the land 36 is pressed except its protrusion 36*a*. Therefore, the protrusion 36*a* of the land 36 is not crushed due to a bonding press. Thus, the protrusion 36*a* of the land 36 is not reduced in height, so that a sufficient space is ensured between the piezoelectric body 45 and the FPC 50. This can prevent ejection failure which may otherwise be caused by occurrence of contact between the FPC 50 and the piezoelectric body 45.

Since the protrusions 36*a* are not pressed in the bonding step, it is likely that, after the bonding step, the height of the protrusion 36*a* differs from land to land. However, an upper face of the protrusion 36*a* of the land 36 is not flat even after the bonding step. When electrically bonding the land 36 to the terminal 53*a*, the upper face of the protrusion 36*a* is pressed and easily deformed. Unevenness of heights of the lands 36 can thereby be absorbed, and the lands 36 and the terminal 53*a* are surely connected to each other.

In addition, when bonding the passage unit 4 and the piezoelectric actuator 21, the plate-like jig 60 does not directly press the piezoelectric body 45, but presses the piezoelectric body 45 with the lands 36 therebetween. This can prevent the jig 60 from getting too close, beyond a limit, to the piezoelectric body 45 during the bonding step. Therefore, even if a small foreign matter exists between the piezoelectric body 45 and the jig 60 or a small protrusion exists on a surface of the piezoelectric body 45, no pressure is applied to the foreign matter or protrusion. Accordingly, occurrence of cracking or the like in the piezoelectric body 45 can be prevented.

The bonding step is performed under the state where the plate-like jig 60 is positioned with the recess 60*a* formed therein being opposed to a central portion of the land 36. Therefore, it is easy to form the protrusion 36*a* on the land 36.

The recess 60*a* formed in the jig 60 is smaller than the contour of the land 36 in a plan view. In the bonding step, the jig 60 is positioned in such a manner that the central portion is surrounded by the peripheral portion 36*b*. This gives the land 36 a highly reliable, stable shape having its protrusion 36*a* surrounded by a portion shorter than the protrusion 36*a*.

Since the recess 60*a* is smaller than the contour of the terminal 53*a* in a plan view, the protrusion 36*a* is not made larger than the contour of the terminal 53*a*. Therefore, the protrusion 36*a* can be formed small, and it is easy for the protrusion 36*a* to come into contact with the terminal 53*a* exposed at the bottom of the through hole 52*a*. In addition, even when the wiring 53 is not covered with the covering layer 52, the protrusion 36*a* hardly comes into contact with another terminal adjacent to the terminal 53*a* that is intended for this protrusion 36*a*.

The depth of the recess 60*a* is larger than the height of the land 36. Accordingly, even when in the bonding step the jig 60 gets close to the piezoelectric actuator 21 to the maximum, the protrusion 36*a* is not lowered by being pressed by the jig 60. It is therefore certain that a sufficient space is ensured between the piezoelectric body 45 and the FPC 50.

The synthetic resin layer 54 is cured at a relatively low temperature of approximately 150 degrees C. Therefore, a drawback caused by heat, such as warping of the piezoelectric body 45, does not easily occur in the connecting step. Moreover, since the uncured synthetic resin is cured by heating at this time, mechanical bond strength between the land 36 and the FPC 50 is improved.

Further, since the jig 60 having the recess 60*a* formed therein is used, it is easy to press only the peripheral portion 36*b* of the land 36 when bonding the passage unit 4 and the piezoelectric actuator 21.

Next, various modifications made to the above-described embodiment will be described. In the following, the same constructions as in the above-described embodiment will be denoted by the same reference numerals, and descriptions thereof will suitably be omitted.

[First Modification]

Figure 8A:
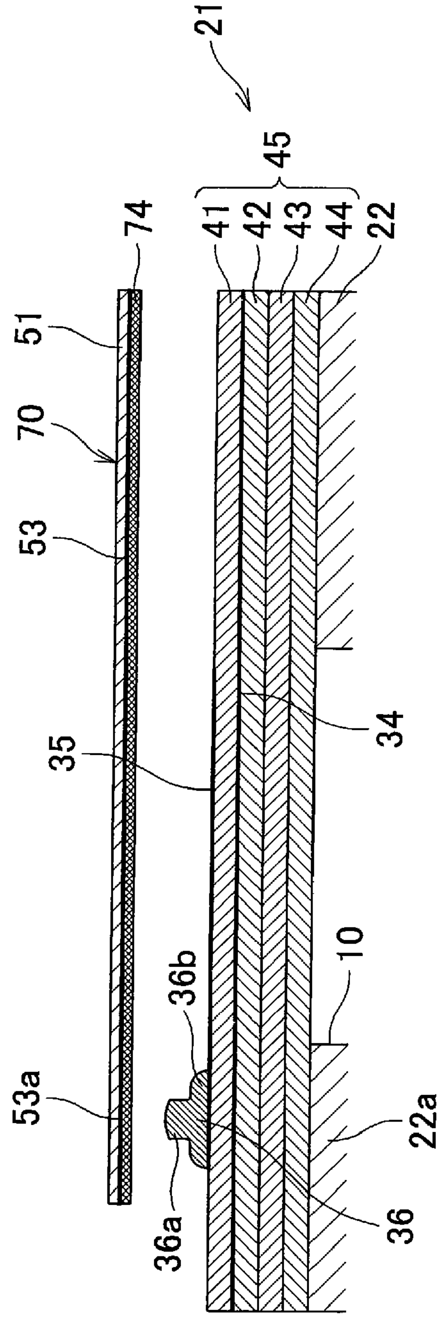
FIGS. 8A and 8B are sectional views corresponding to FIGS. 7C and 7D, respectively, and showing a manufacturing method according to a first modification of the embodiment of the present invention.
Figure 8B:
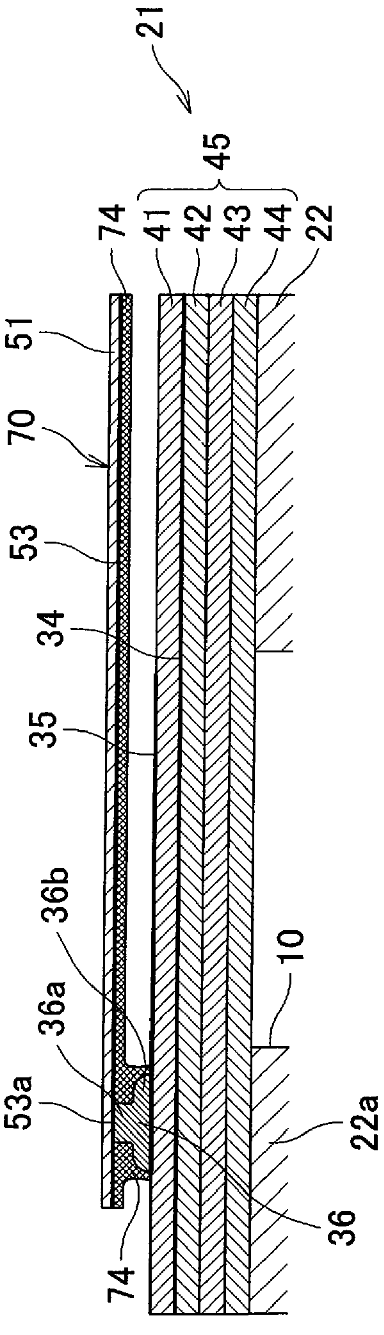

In a first modification, as shown in FIG. 8A, an uncured thermosetting synthetic resin layer 74 instead of the covering layer 52 is formed on a lower face of the wiring 53. In the connecting step, as shown in FIG. 8B, by use of an unillustrated plate-like jig capable of temperature control with a built-in heater, the land 36 of the piezoelectric actuator 21 is pressed by the FPC 70 which has been positioned in such a manner that the protrusion 36*a* and the terminal 53*a* overlap each other in a plan view, while heating up to a curing temperature of the synthetic resin layer 74 or higher. At this time, the synthetic resin layer 74 is once softened in a curing process. The protrusion 36*a* of the land 36 penetrates the synthetic resin layer 74 thus softened, to reach the terminal 53*a* thereby electrically bonding the land 36 to the terminal 53*a*. Then, the synthetic resin layer 74 is cured, to physically fix the land 36 to the FPC 70. Further, a whole of the lower face of the wiring 53 is covered with the cured synthetic resin layer 74. Consequently, the wiring 53 can surely be kept insulated from its neighboring wiring 53.

[Second Modification]

Figure 9A:
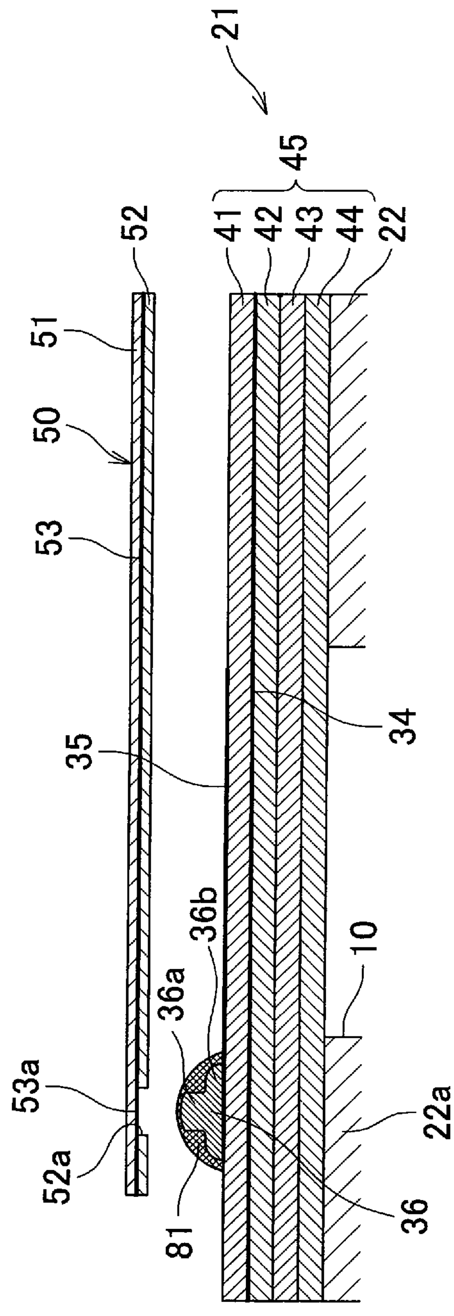
FIGS. 9A and 9B are sectional views corresponding to FIGS. 7C and 7D, respectively, and showing a manufacturing method according to a second modification of the embodiment of the present invention.

In another modification, as shown in FIG. 9A, an uncured synthetic resin layer 81 made of a thermosetting synthetic resin material is formed on an upper face of the land 36 after the bonding step, to cover the land 36 with the synthetic resin layer 81 (resin layer forming step).

Figure 9B:
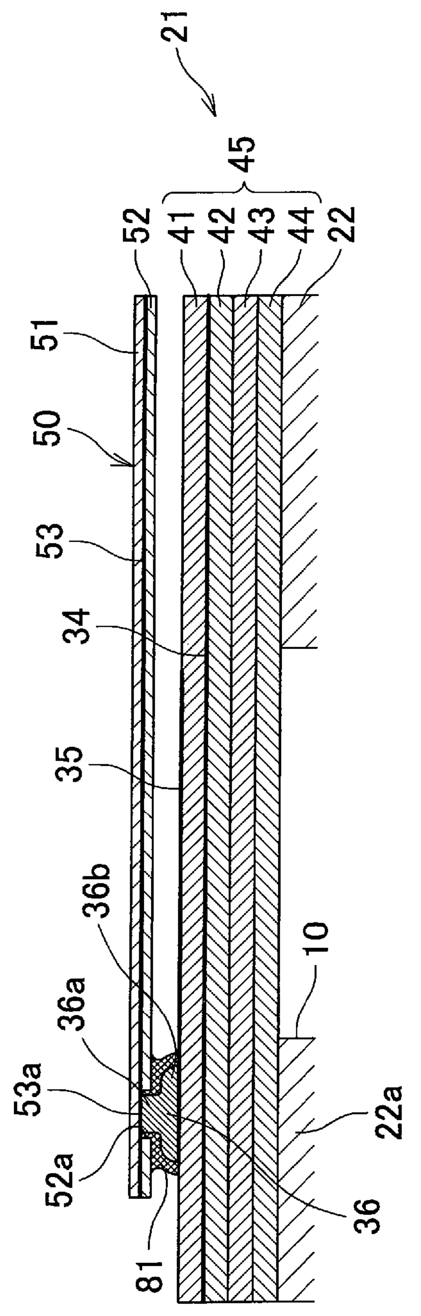

Then in the connecting step, as shown in FIG. 9B, by use of an unillustrated plate-like jig capable of temperature control with a built-in heater, the land 36 is pressed by the FPC 50 which has been positioned in such a manner that the protrusion 36*a* and the terminal 53*a* overlap each other in a plan view, while heating up to a curing temperature of the synthetic resin layer 81 or higher. At this time, the synthetic resin layer 81 is once softened in a curing process. The protrusion 36*a* of the land 36 penetrates the synthetic resin layer 81 thus softened, to reach the terminal 53*a* thereby electrically bonding the land 36 to the terminal 53*a*. Then, the synthetic resin layer 81 is cured, to physically fix the land 36 to the FPC 50.

The synthetic resin layer 81 is cured at a relatively low temperature of approximately 150 degrees C. Therefore, a drawback caused by heat, such as warping of the piezoelectric body 45, does not easily occur in the connecting step. Moreover, since the uncured synthetic resin is cured by heating at this time, mechanical bond strength between the land 36 and the FPC 50 is improved.

[Third Modification]

Figure 10A:
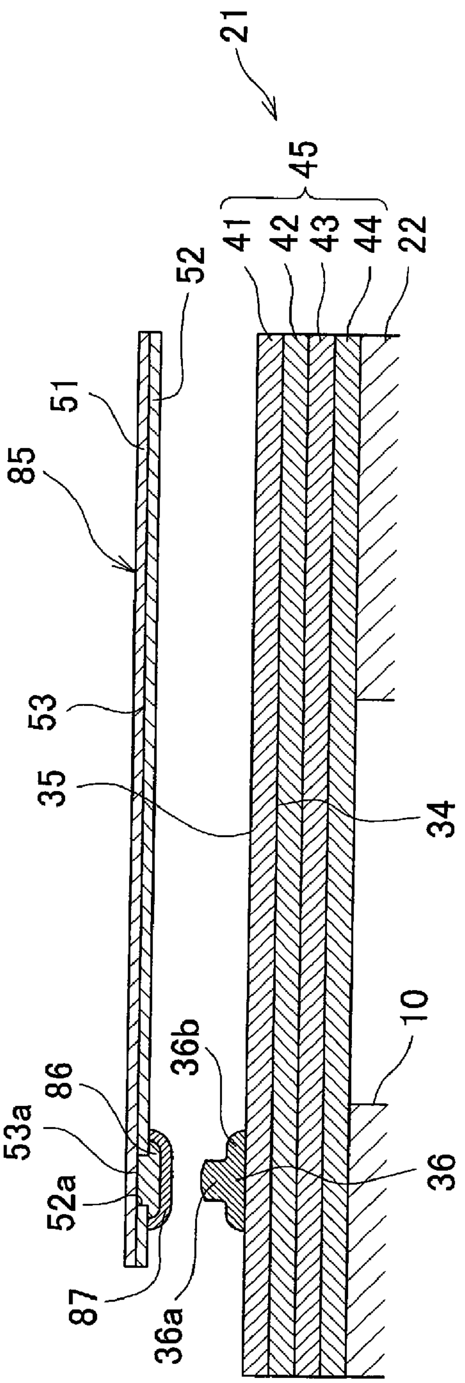
FIGS. 10A and 10B are sectional views corresponding to FIGS. 7C and 7D, respectively, and showing a manufacturing method according to a third modification of the embodiment of the present invention.

In another modification, an FPC 85 as shown in FIG. 10A is adopted. In the FPC 85, the terminal 53*a* is covered with a bump 86 made of a conductive material. The bump 86 fills up the through hole 52*a* and further spreads to cover a part of a lower face of the covering layer 52. In addition, a lower face of the bump 86 is covered with a solder layer 87. A softening temperature of the bump 86 is higher than a softening temperature of the solder layer 87.

Figure 10B:
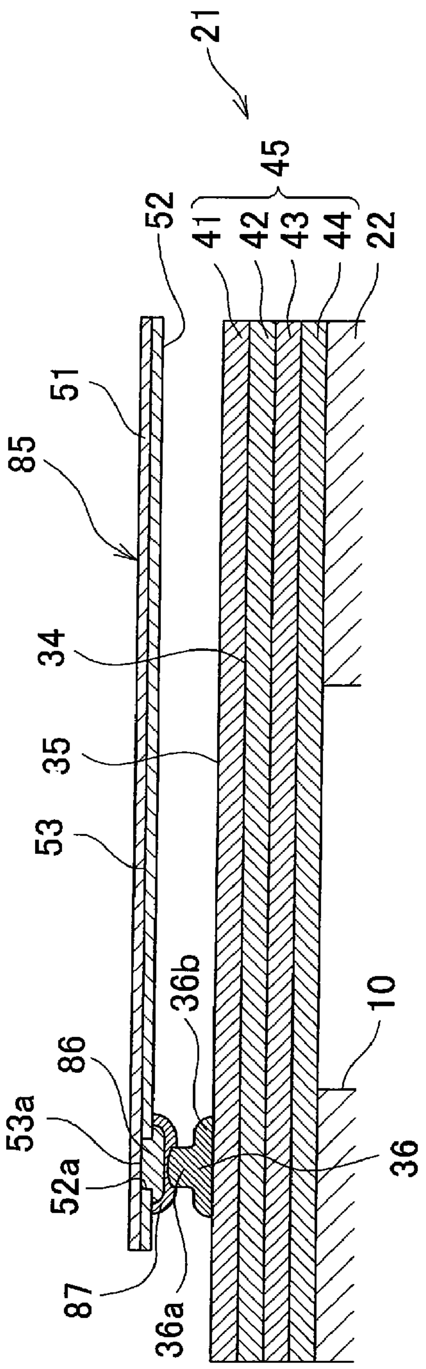

In the connecting step in this case, as shown in FIG. 10B, by use of an unillustrated plate-like jig capable of temperature control with a built-in heater, the land 36 is pressed by the FPC 85 which has been positioned in such a manner that the protrusion 36*a* and the terminal 53*a* overlap each other in a plan view, while heating up to a temperature that is equal to or higher than a softening temperature of the solder layer 87 and lower than a softening temperature of the bump 86. The solder layer 87 is thereby melted, and the protrusion 36*a* of the land 36 enters the solder layer 87. By stopping heating, the solder layer 87 is cured, and the protrusion 36*a* and the solder layer 87 are electrically bonded to each other. Thus, the land 36 is electrically connected to the terminal 53*a*.

It may also be possible that an upper end of the protrusion 36*a* penetrates the solder layer 87 and reaches the bump 86. Besides, an uncured synthetic resin layer may be formed so as to cover the land 36. This synthetic resin layer is cured by the heating in the bonding. Thus, the cured synthetic resin layer directly bonds the piezoelectric body 45 to the FPC 85 while preventing excessive spreading of the melted solder. That is, the spreading of the solder can be restricted to the vicinity of the land 36.

[Fourth Modification]

Figure 11:
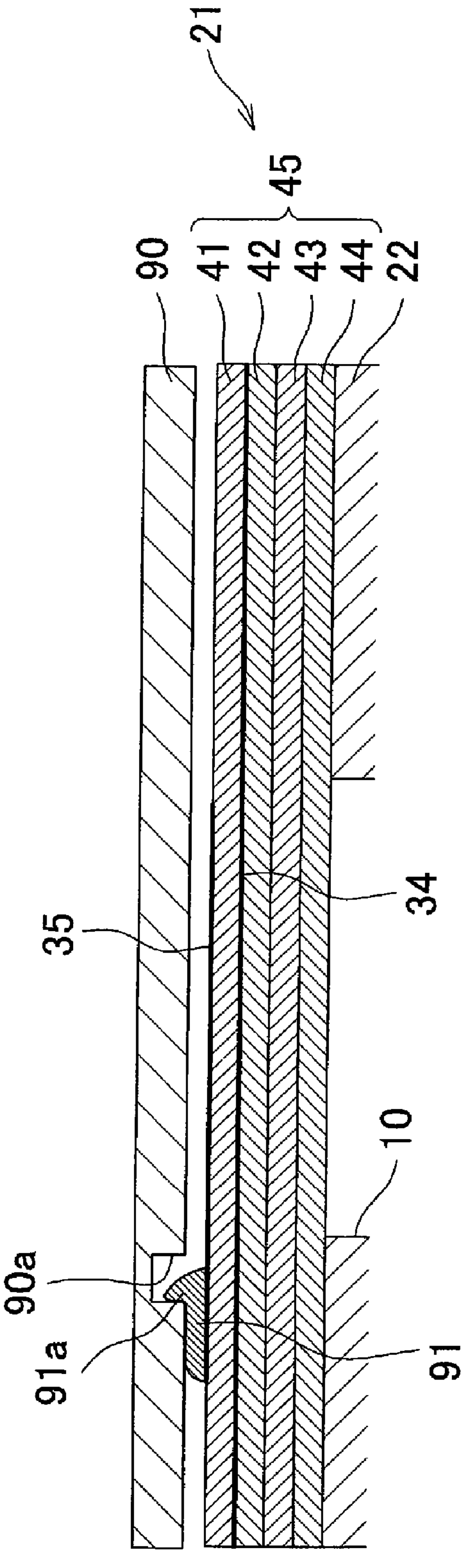
FIG. 11 is a sectional view corresponding to FIG. 7B, and showing a manufacturing method according to a fourth modification of the embodiment of the present invention.

In another modification, in the bonding step, a jig 90 is disposed as shown in FIG. 11, in such a manner that a part of a recess 90*a* formed in the jig 90, which means a left end portion of the recess 90*a* in FIG. 11, overlaps a land 91 in a plan view while a remaining part of the recess 90*a*, which means a right end portion of the recess 90*a* in FIG. 11, does not overlap the land 91 in a plan view. In this condition, the land 91 is pressed by the jig 90. Here, a diameter of the recess 90*a* is smaller than a diameter of the land 91, and a depth of the recess 90*a* is smaller than a height of the land 91.

In this case, after the bonding step, a protrusion 91*a* appears at a right end portion of the land 91, while a remaining portion of the land 91 is pressed by the jig 90 and therefore flattened. The land 91 may be electrically connected to the terminal 53*a* by, in the connecting step, making the protrusion 91*a* and the terminal 53*a* overlap each other in a plan view.

[Fifth Modification]

Figure 12:
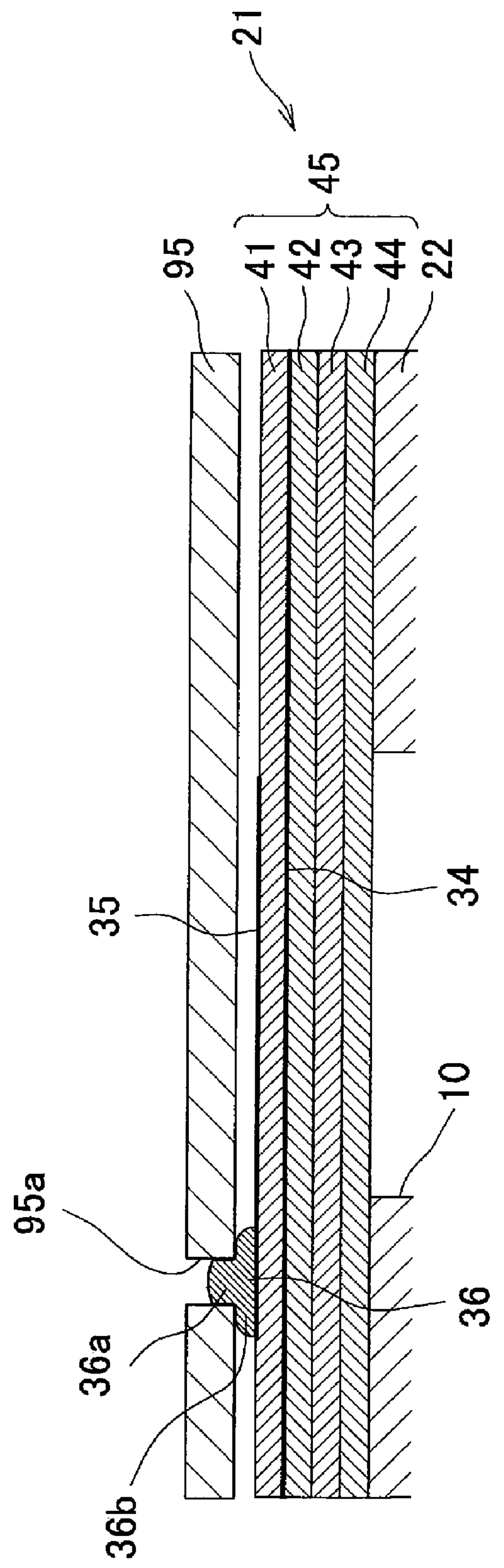
FIG. 12 is a sectional view corresponding to FIG. 7B, and showing a manufacturing method according to a fifth modification of the embodiment of the present invention.

In another modification, as shown in FIG. 12, a jig 95 having a through hole 95*a* formed therein is used. A diameter of the through hole 95*a* is smaller than a diameter of the land 36. In the bonding step, the jig 95 is disposed so as to make the through hole 95*a* overlap the central portion of the land 36 in a plan view, and then the jig 95 presses the land 36 while heating. Thereby, the passage unit 4 and the piezoelectric actuator 21 are bonded to each other. In this case as well, a portion of the land 36 overlapping the through hole 95*a* is not pressed, so that the protrusion 36*a* is formed on the land 36 in the bonding step. At this time, even if the protrusion 36*a* passes through the through hole 95*a* and protrudes out from an opposite side of the through hole 95*a*, the protrusion 36*a* can be kept at a desired height all the easier regardless of a thickness of the jig 95, because nothing restricts the protrusion 36*a*.

[Other Modifications]

A piezoelectric body may include one to three piezoelectric layers, or alternatively may include five or more piezoelectric layers. However, in consideration of producing unimorph deformation, it is preferable that the piezoelectric body includes one or more active layers and one or more inactive layers.

In the above-described embodiment, the land is provided on the individual electrode that is formed on the surface of the piezoelectric body. However, the land may not necessarily be provided on the individual electrode but on any electrode, as long as the electrode is formed on the surface of the piezoelectric body.

In a case where the thermosetting adhesive is not interposed between the passage unit and the piezoelectric actuator, heating is not required in the bonding step.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A method of manufacturing an ink-jet head comprising:

a passage unit that has an individual ink passage including an ink ejection port and a pressure chamber, and also has a surface on which the pressure chamber is provided in a form of a recess;

a piezoelectric actuator that applies ejection energy to ink in the pressure chamber, the piezoelectric actuator including a piezoelectric body that is disposed on the surface of the passage unit to thereby close the recess, an electrode that is formed, so as to be opposed to the pressure chamber, on a surface of the piezoelectric body facing against the passage unit, and a conductive land that is formed on the electrode; and a wire member that includes a substrate and a wiring formed on the substrate and provided thereon with a terminal electrically connected to the land, the method comprising the steps of:

forming, on the electrode, the land made of a resin paste including a conductive material, in a state where a whole of a face of the piezoelectric actuator opposite to a face thereof formed with the land is supported on a support member;

bonding the passage unit and the piezoelectric actuator to each other by pressing the land except a part thereof in a state where the piezoelectric actuator is disposed on the surface of the passage unit with the electrode being opposed to the pressure chamber; and electrically connecting the land to the terminal by bringing the part of the land not pressed in the step of bonding into contact with the wire member.

2. The method according to claim 1, wherein, in the step of bonding, the land is pressed by a plate-like jig in a state where the jig is positioned in such a manner that a recess or a through hole formed in the jig is opposed to the part of the land.

3. The method according to claim 2, wherein:

the recess or the through hole is smaller than a contour of the land, when seen in a direction perpendicular to the surface of the piezoelectric body; and in the step of bonding, the jig is positioned in such a manner that the part of the land is surrounded by such a part of the land as to be pressed by the jig.

4. The method according to claim 2, wherein the recess or the through hole is smaller than a contour of the terminal, when seen in a direction perpendicular to the surface of the piezoelectric body.

5. The method according to claim 2, wherein a depth of the recess is larger than a height of the land.

6. The method according to claim 1, wherein, in the step of bonding, the land except a part thereof is pressed while heating is performed.

7. The method according to claim 1, wherein, in the step of bonding, a thermosetting adhesive is interposed between the passage unit and the piezoelectric actuator, and heated up to its curing temperature or higher.

8. The method according to claim 1, wherein:

the wire member includes a thermosetting synthetic resin layer that covers the terminal:

before the step of connecting, the synthetic resin layer is uncured; and in the step of connecting, the land is pressed by the wire member while heating is performed, so that the part of the land penetrates the uncured synthetic resin layer to thereby electrically bond the part to the terminal while the synthetic resin layer is cured to thereby physically fix the land to the wire member.

9. The method according to claim 1, further comprising, after the step of bonding and before the step of connecting, the step of forming an uncured, thermosetting synthetic resin layer that covers the land, wherein, in the step of connecting, the land is pressed by the wire member while heating is performed, so that the part of the land penetrates the uncured synthetic resin layer to thereby electrically bond the part to the terminal while the synthetic resin layer is cured to thereby physically fix the land to the wire member.

* * * * *